United States Patent
Kim

(10) Patent No.: US 6,852,599 B2
(45) Date of Patent: Feb. 8, 2005

(54) METHOD FOR FABRICATING MOS TRANSISTORS

(75) Inventor: Tae W Kim, Icheon-Si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 10/627,277

(22) Filed: Jul. 25, 2003

(65) Prior Publication Data

US 2004/0018689 A1 Jan. 29, 2004

(30) Foreign Application Priority Data

Jul. 25, 2002 (KR) .............................. 10-2002-0043794

(51) Int. Cl.[7] .......................................... H01L 21/336
(52) U.S. Cl. ...................... 438/289; 438/217; 438/223; 438/227; 438/231; 438/291; 438/298; 438/305; 438/585; 438/595; 438/740; 438/751; 438/756; 438/757
(58) Field of Search ................................. 438/217, 225, 438/227, 228, 230, 231, 289, 291, 297, 298, 303, 585, 595, 740, 751, 756, 757, 221, 223, 224, 305

(56) References Cited

U.S. PATENT DOCUMENTS

| | | | | |
|---|---|---|---|---|
| 3,859,222 A | * | 1/1975 | Squillace et al. .......... | 252/79.3 |
| 5,384,279 A | * | 1/1995 | Stolmeijer et al. .......... | 438/217 |
| 5,698,461 A | * | 12/1997 | Liu ............................. | 438/291 |
| 5,750,430 A | * | 5/1998 | Son ............................. | 438/303 |
| 5,786,256 A | * | 7/1998 | Gardner et al. ............. | 438/305 |
| 5,856,225 A | * | 1/1999 | Lee et al. .................... | 438/291 |
| 5,877,056 A | * | 3/1999 | Wu ............................. | 438/291 |
| 5,960,270 A | * | 9/1999 | Misra et al. ................. | 438/197 |
| 6,117,739 A | * | 9/2000 | Gardner et al. ............. | 438/289 |
| 6,159,808 A | * | 12/2000 | Chuang ....................... | 438/291 |
| 6,177,336 B1 | * | 1/2001 | Lin et al. ..................... | 438/592 |
| 6,180,468 B1 | * | 1/2001 | Yu et al. ...................... | 438/297 |
| 6,200,865 B1 | * | 3/2001 | Gardner et al. ............. | 438/291 |
| 6,204,148 B1 | * | 3/2001 | Gardner et al. ............. | 438/430 |
| 6,251,760 B1 | * | 6/2001 | Son ............................. | 438/585 |
| 6,300,201 B1 | * | 10/2001 | Shao et al. .................. | 438/281 |
| 6,344,397 B1 | * | 2/2002 | Horstmann et al. ......... | 438/300 |
| 6,395,606 B1 | * | 5/2002 | Huster et al. ................ | 438/289 |
| 6,410,394 B1 | * | 6/2002 | Shao et al. .................. | 438/289 |
| 6,518,113 B1 | * | 2/2003 | Buynoski ..................... | 438/217 |
| 2002/0137294 A1 | * | 9/2002 | Wu et al. ..................... | 438/289 |

* cited by examiner

Primary Examiner—Amir Zarabian
Assistant Examiner—Toniae M. Thomas
(74) Attorney, Agent, or Firm—Andrew D. Fortney

(57) ABSTRACT

A method for fabricating a metal oxide semiconductor (MOS) transistor, which can reduce the junction capacitance without degradation of transistor characteristics including forming a buffer oxide layer on a semiconductor substrate; successively conducting ion implantations for well formation and field stop formation in the substrate through the buffer oxide layer; removing the buffer oxide layer; forming and patterning a sacrificial layer to form a trench successively conducting ion implantations for threshold voltage adjustment and punch stop formation on the semiconductor substrate area exposed by the trench; forming a gate oxide layer on the exposed surface of the substrate; forming a polysilicon layer so as to completely fill the trench; polishing the polysilicon layer to form a gate electrode; removing the sacrificial layer; forming an LDD region in the substrate; forming spacers on side walls of the gate electrode; and forming source/drain regions.

20 Claims, 4 Drawing Sheets

(PRIOR ART)

METHOD FOR FABRICATING MOS TRANSISTORS

BACKGROUND OF THE INVENTION

1. Field of the Invention

The present invention relates to a method for fabricating semiconductor devices, more particularly to a method for fabricating metal oxide semiconductor (MOS) transistors, which can reduce the junction capacitance without a degradation of characteristics in a transistor even in gate line narrowing.

2. Description of the Prior Art

As generally known in the art, with the high-integration of semiconductor devices, the line narrowing of a gate electrode has been caused so that the length of a channel has been reduced, which generates a short channel effect by which threshold voltage of a transistor is rapidly reduced. Thus, various technologies have been proposed so as to reduce the short channel effect.

Herein, the prevention of the short channel effect is a problem to be solved for a high integration of a semiconductor device. One way to solve the problem is to form a lightly doped drain (LDD) region.

An MOS transistor of the prior art adapting LDD structure will be now described with reference to FIGS. 1A to 1C.

Referring to FIG. 1A, ion implantation processes for well formation, field stop formation, punch stop formation and threshold voltage adjustment are successively conducted to the whole area of a semiconductor substrate 1 having a trench type isolation layer 2. Then, a gate oxide layer 3a and a gate conductive layer 3b are successively formed, and the gate oxide layer 3a and the gate conductive layer 3b are patterned to form a gate electrode 4.

Referring to FIG. 1B, ion implantation of low concentration impurities is conducted to the semiconductor substrate 1 including the gate electrode 4 to form LDD regions 5 on both side portions of the gate electrode 4. Then, an oxide layer 6a and a nitride layer 6b are successively deposited on the semiconductor substrate 1 so as to cover the gate electrode 4.

Referring to FIG. 1C, the oxide layer 6a and the nitride layer 6b are blanket etched to form spacers 7 on both side walls of the gate electrode 4. Then, ion implantation of high concentration impurities is conducted to the whole area of the substrate, and an annealing treatment is conducted to former to form source/drain regions 8 with an LDD region 5 formed in the substrate on both side portions of the gate electrode 4.

However, in the fabricating method of MOS transistor of the prior art, ion implantation processes for well formation, field stop formation, punch stop formation and threshold voltage adjustment are successively conducted to the whole area of active region of the semiconductor substrate so as to reduce a shot channel effect, thus increasing dopants concentration of well in the source/drain regions.

In this case, the increase or the dopants concentration of well causes a generation of the junction capacitance in the source/drain region, and the junction capacitance causes a delay of gate signal, which functions to reduce reliability of the semiconductor device. Particularly, these are some of the problems to be solved in conjunction with the tendency of gradual increase of degradation of device characteristics due to a short channel effect according to a gradual reduction of critical dimensions of the gate electrode.

SUMMARY OF THE INVENTION

Accordingly, the present invention has been made to solve the above-mentioned problems occurring in the prior art, and an object of the present invention is to provide a method for fabricating MOS transistors, which can reduce the junction capacitance without a degradation of characteristics in a transistor even in gate line narrowing.

In order to accomplish this object, there is provided a method for fabricating MOS transistors, the method comprising the steps of: forming a buffer oxide layer on a semiconductor substrate having an isolation layer; successively conducting ion implantations for well formation and field stop formation in an active region of the substrate through the buffer oxide layer; removing the buffer oxide layer; forming a sacrificial layer on the semiconductor substrate; patterning the sacrificial layer to form a trench defining a gate electrode forming region; successively conducting ion implantations for threshold voltage adjustment and punch stop formation on the semiconductor substrate area exposed by the trench; forming a gate oxide layer on the surface of the substrate under the bottom face of the trench; forming a polysilicon layer on the sacrificial layer so as to completely bury the trench; polishing the polysilicon layer until the surface of the sacrificial layer is exposed, so as to form a gate electrode; removing the sacrificial layer; forming an LDD region in the surface of the substrate at both side portions of the gate electrode; forming spacers on both side walls of the gate electrode; and forming the source/drain regions in the surface of the substrate at both side portions of the gate electrode including the spacers.

According to the present invention, since the ion implantations for threshold voltage adjustment and punch stop formation are conducted only to the channel region, an increase of the junction capacitance can be prevented, thus avoiding degradation of characteristics of devices.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1A:
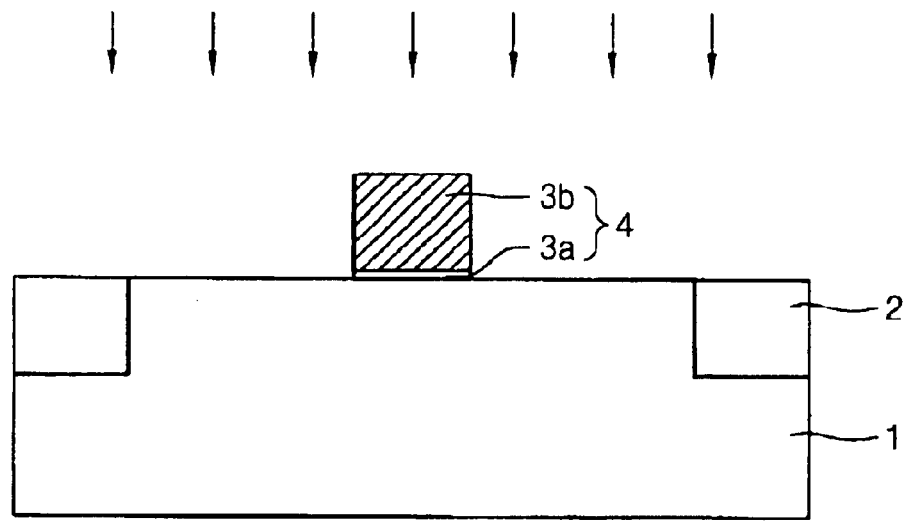
FIGS. 1A to 1C are end views showing a fabricating method of MOS transistors of the prior art according to every processes.
Figure 1B:
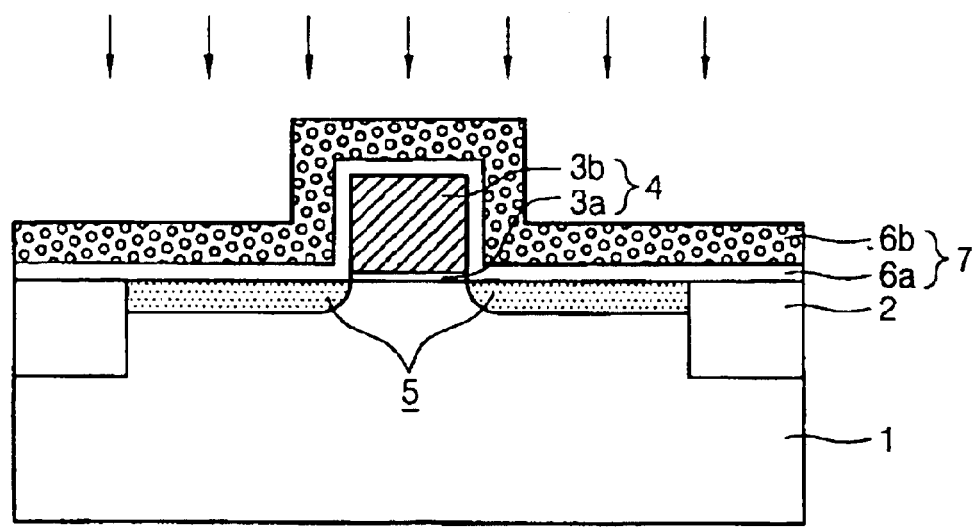
Figure 1C:
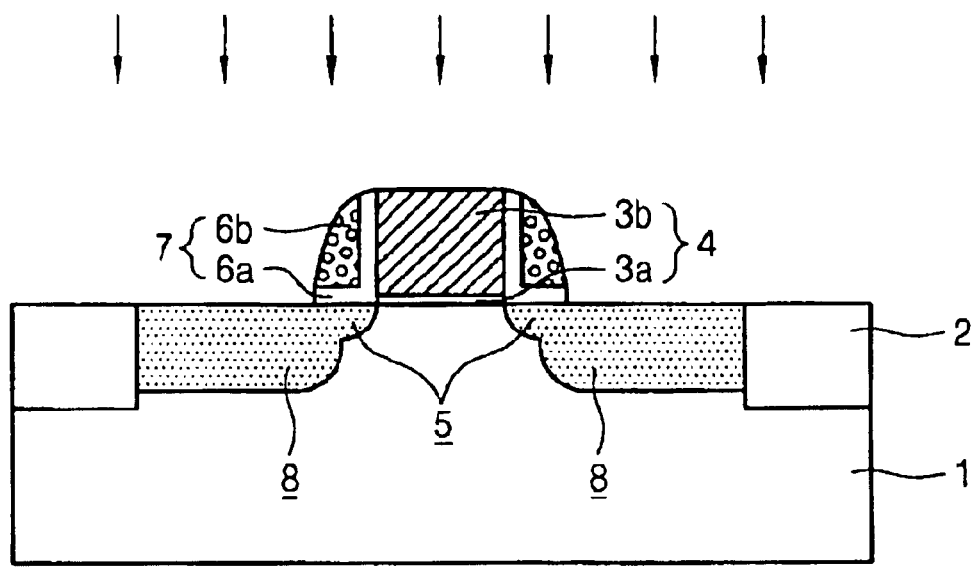

Hereinafter, a preferred embodiment of the present invention will be described with reference to the accompanying drawings. In the following description and drawings, the same reference numerals are used to designate the same or similar components, and so repetition of the description of the same or similar components will be omitted.

FIGS. 2A to 2E are end views showing a fabricating method of MOS transistors of an embodiment of the present invention according to every processes.

Figure 2A:
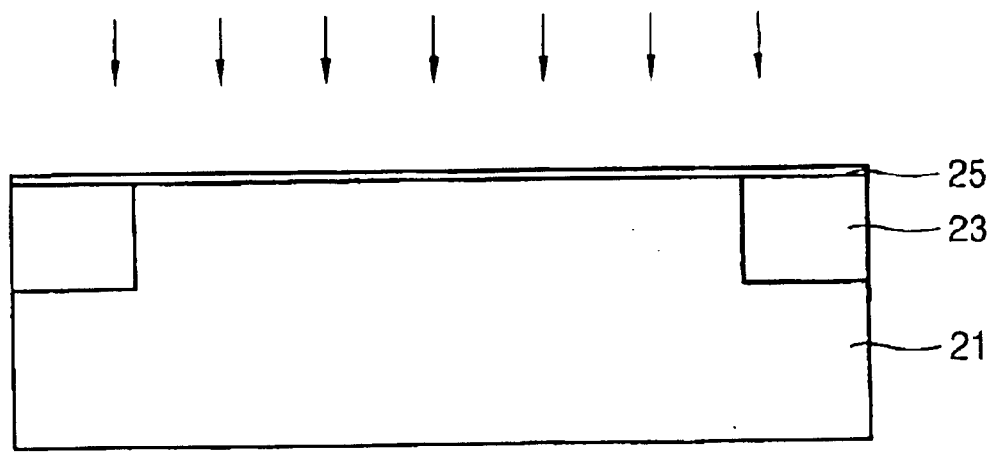
FIGS. 2A to 2E are end views showing a fabricating method of MOS transistors of an embodiment of the present invention according to every processes.

Referring to the FIG. 2A, a buffer oxide layer 25 is formed on a semiconductor substrate 21 having a trench type isolation layer 23. Then, ion implantations for well formation and field stop formation are successively conducted to an active region of the substrate 21 through the buffer oxide layer 25.

Figure 2B:
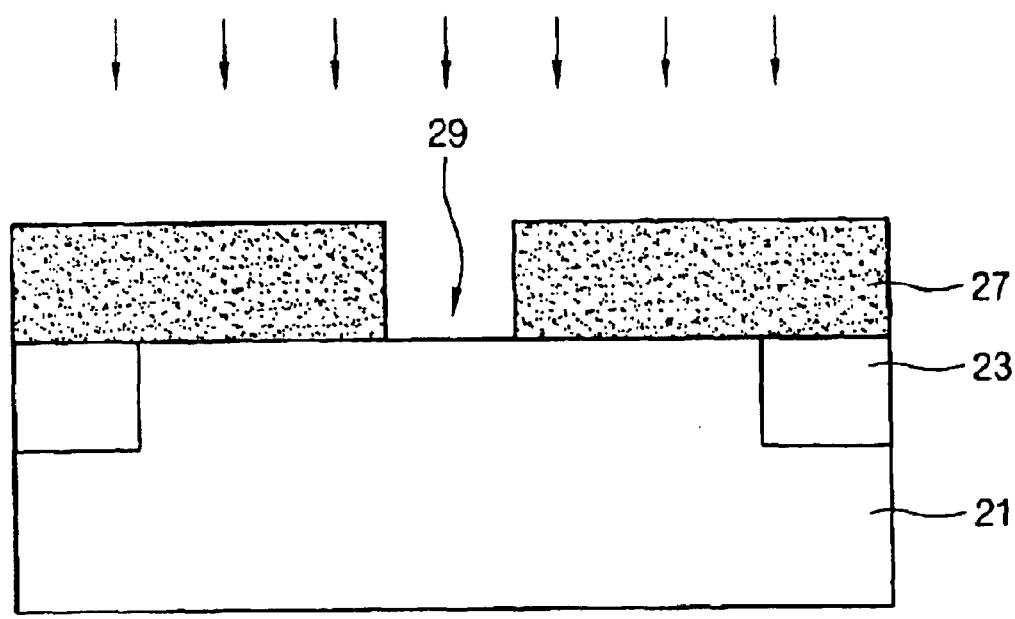

Referring to the FIG. 2B, the buffer oxide layer is removed and a sacrificial layer 27 composed of a chemical vapor deposition (CVD) oxide layer is formed on the semiconductor substrate 21 so as to have a thickness ranging for example between 500 Å and 1000 Å, corresponding to a desired thickness of a gate electrode. Then, the sacrificial layer 27 is patterned to form a trench 29 defining a gate electrode forming region according a conventional photolithography process. In this case, the patterning of the sacrificial layer is implemented by wet-etching process. Then, ion implantations for threshold voltage adjustment and punch stop formation are successively implemented only on an area of the semiconductor substrate 21, i.e., a channel formation region of MOS transistor. As a result, ion implantation for punch stop formation is conducted only under the to-be-gate electrode area. The impurity for well formation and field stop formation is boron or phosphorous or Arsenic. Implants are made at a sufficient energy to form a specific region, for example, barriers below the source/drain junction for well and field stop or threshold voltage adjustment and punch stop.

Figure 2C:
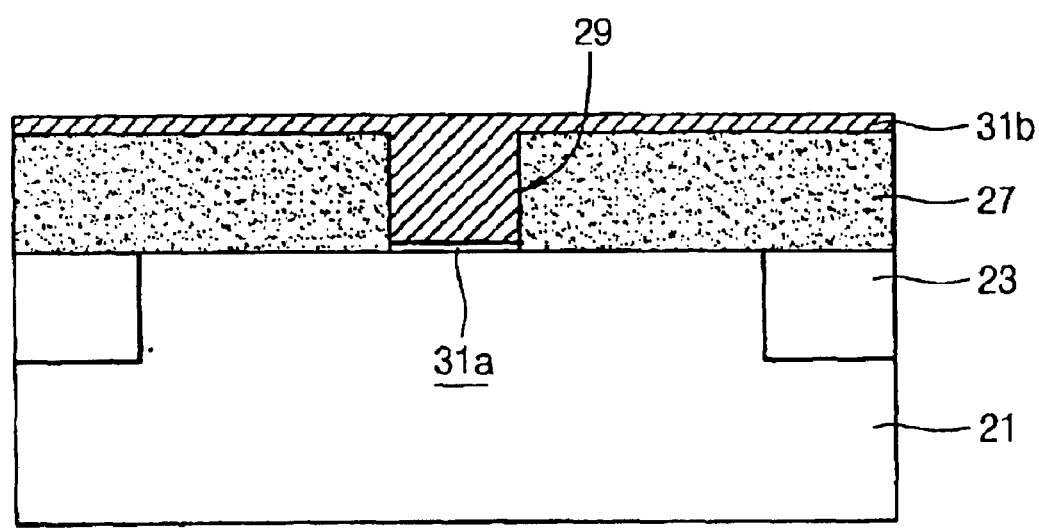

Referring to the FIG. 2C, a gate oxide layer 31a is formed on the surface of the substrate 21 at the bottom face of the trench 29 using an oxidation process, and a polysilicon layer 31b is formed on the sacrificial layer 27 so as to completely fill the trench 29.

Figure 2D:
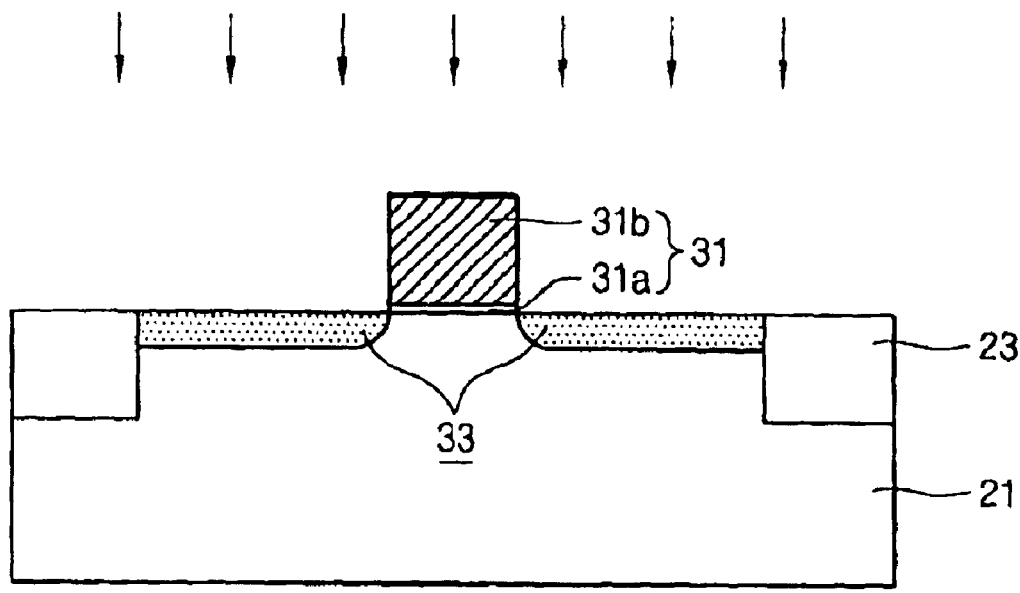

Referring to the FIG. 2D, the polysilicon layer 31b is polished until the surface of the sacrificial layer is exposed, thus forming a gate electrode 31. Then, after the sacrificial layer is removed, an LDD region 33 is formed by an ion implantation of low concentration impurities and a subsequent annealing treatment for the resultant substrate.

Figure 2E:
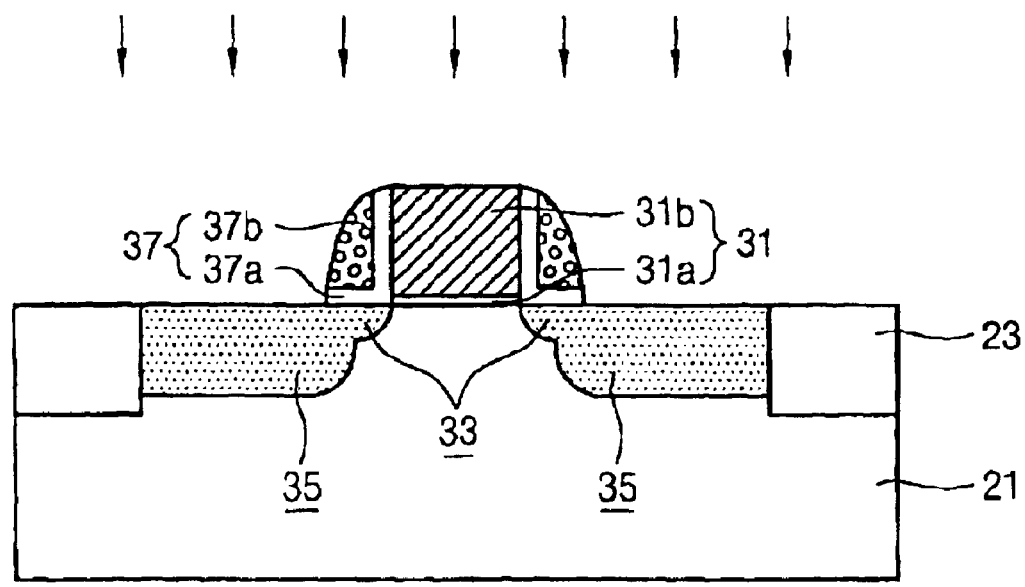

Referring to the FIG. 2E, an oxide layer 37a and a nitride layer 37b are successively formed on the whole area of the substrate so as to cover the gate electrode 31. Then, the oxide layer 37a and the nitride layer 37b are blanket etched to form spacers 37 on both sidewalls of the gate electrode 37. Then, the source/drain regions 35 are formed in the surface of the substrate at both side portions of the gate electrode 37 by an ion implantation of high concentration impurities and a subsequent annealing treatment for the substrate resulted from the previous step. With the result of the former steps, MOS transistor of the present invention is achieved.

According to the present invention, since the ion implantations for threshold voltage adjustment and punch stop formation are conducted only to the channel forming region, an increase of the junction capacitance can be prevented in comparison with the conventional technology in which all fabricating procedures thereof are conducted to the whole area of the active region.

As described above, in the fabricating method of MOS transistor of the present invention, a trench defining a gate electrode region is formed, and ion implantation processes for threshold voltage adjustment and punch stop formation are conducted only to the channel forming region using the trench, thus preventing an increase of dopants concentration of well in the source/drain regions. Accordingly, the junction capacitance can be reduced without a degradation of the characteristics of the transistor even though a length of the gate electrode is reduced, reducing a delay of gate signal and thus improving reliability of semiconductor devices.

Although preferred embodiments of the present invention have been described for illustrative purposes, those skilled in the art will appreciate that various modifications, additions and substitutions are possible, without departing from the scope and spirit of the invention as disclosed in the accompanying claims.

What is claimed is:

1. A method for fabricating one or more MOS transistors, the method comprising the steps of:

forming a buffer oxide layer on a semiconductor substrate having an isolation layer;

conducting ion implantations for well formation and field stop formation in an active region of the substrate through the buffer oxide layer;

removing the buffer oxide layer;

forming a sacrificial oxide layer on the semiconductor substrate;

patterning the sacrificial oxide layer to form a trench defining a gate electrode forming region; and conducting ion implantations for threshold voltage adjustment and punch stop formation in the semiconductor substrate area under the trench.

2. A method for fabricating one or more MOS transistors, the method comprising the steps of:

forming a buffer oxide layer on a semiconductor substrate having an isolation layer;

conducting ion implantations for well formation and field stop formation in an active region of the substrate through the buffer oxide layer;

removing the buffer oxide layer;

forming a sacrificial oxide layer on the semiconductor substrate;

patterning the sacrificial oxide layer to form a trench defining a gate electrode forming region;

conducting ion implantations for threshold voltage adjustment and punch stop formation in the semiconductor substrate area exposed by the trench;

forming a gate oxide layer on the exposed surface of the substrate;

forming a gate electrode layer on the sacrificial oxide layer so as to completely fill the trench;

polishing the gate electrode layer until the surface of the sacrificial oxide layer is exposed, so as to form a gate electrode;

removing the sacrificial oxide layer;

forming an LDD region in the surface of the substrate at both side portions of the gate electrode;

forming spacers on both side walls of the gate electrode; and forming source/drain regions in the surface of the substrate at both side portions of the gate electrode including the spacers.

3. The method for fabricating MOS transistors as claimed in claim 1, wherein ion implantation for punch stop formation is conducted only in the semiconductor substrate area under the trench.

4. The method for fabricating MOS transistors as claimed in claim 1, wherein the sacrificial oxide layer comprises a chemical vapor deposition (CVD) oxide layer.

5. The method for fabricating MOS transistors as claimed in claim 1, wherein the sacrificial oxide layer has a thickness ranging between 500 Å and 1000 Å.

6. The method for fabricating MOS transistors as claimed in claim 1, wherein the patterning of the sacrificial oxide layer comprises wet-etching the sacrificial oxide layer.

7. The method for fabricating MOS transistors as claimed in claim 1, wherein ions implanted for well formation and field stop formation comprise boron, phosphorous or Arsenic.

8. The method for fabricating MOS transistors as claimed in claim 1, wherein ion implantation for field stop formation is conducted at a sufficient energy to form a barrier below a source/drain junction.

9. The method as claimed in claim 2, wherein ion implantation for punch stop formation is conducted only in the semiconductor substrate area exposed by the trench.

10. The method as claimed in claim 2, wherein the sacrificial oxide layer comprises a chemical vapor deposition (CVD)) oxide layer.

11. The method as claimed in claim 2, wherein the sacrificial layer has a thickness ranging between 500 Å and 1000 Å.

12. The method as claimed in claim 2, wherein the patterning of the sacrificial oxide layer comprises wet-etching the sacrificial oxide layer.

13. The method as claimed in claim 2, wherein ions implanted for well formation and field stop formation comprise boron, phosphorous or Arsenic.

14. The method as claimed in claim 2, wherein ion implantation for field stop formation is conducted at a sufficient energy to form a barrier below a source/drain junction.

15. The method as claimed in claim 2, wherein said gate electrode layer comprises polysilicon.

16. The method as claimed in claim 1, wherein the sacrificial oxide layer consists essentially of an oxide layer.

17. The method as claimed in claim 16, wherein the sacrificial oxide layer has a thickness ranging between 500 Å and 1000 Å.

18. A method for fabricating a MOS transistor, comprising the steps of:

conducting ion implantations for threshold voltage adjustment and punch stop formation in an exposed semiconductor substrate area, said semiconductor substrate having an isolation layer therein and a patterned sacrificial oxide layer thereon, the patterned sacrificial oxide layer having a trench therein (i) defining a gate electrode forming region and (ii) exposing said exposed semiconductor substrate area;

forming a gate electrode in the trench;

removing the patterned sacrificial oxide layer;

forming an LDD region in the substrate at side portions of the gate electrode;

forming spacers on side walls of the gate electrode; and forming source/drain regions in areas of the substrate not covered by the gate electrode and the spacers.

19. The method as claimed in claim 18, wherein the sacrificial oxide layer consists essentially of an oxide layer.

20. The method as claimed in claim 18, wherein the sacrificial layer comprises a chemical vapor deposition (CVD) oxide layer.

* * * * *